United States Patent
Huynh et al.

(10) Patent No.: US 6,190,237 B1
(45) Date of Patent: Feb. 20, 2001

(54) PH-BUFFERED SLURRY AND USE THEREOF FOR POLISHING

(75) Inventors: Cuc Kim Huynh, Jericho, VT (US); Mahadevaiyer Krishnan, Hopewell Junction; Michael Joseph MacDonald, Yorktown Heights, both of NY (US); Mark Peter Murray, Essex Junction, VT (US)

(73) Assignee: International Business Machines Corporation, Armonk, NY (US)

(*) Notice: Under 35 U.S.C. 154(b), the term of this patent shall be extended for 0 days.

(21) Appl. No.: 08/965,218

(22) Filed: Nov. 6, 1997

(51) Int. Cl.⁷ ................................................... B24B 1/00
(52) U.S. Cl. ............................................ 451/41; 438/692
(58) Field of Search ............................. 516/78; 451/36, 451/41; 438/692

(56) References Cited

U.S. PATENT DOCUMENTS

| | | | |
|---|---|---|---|
| 4,680,893 | 7/1987 | Cronkhite et al. | 51/5 R |
| 4,895,675 * | 1/1990 | Smith | 510/397 |
| 5,084,071 * | 1/1992 | Nenadic et al. | 51/308 |
| 5,197,999 | 3/1993 | Thomas | 51/298 |
| 5,209,816 | 5/1993 | Yu et al. | 156/636 |
| 5,212,910 | 5/1993 | Breivogel et al. | 51/398 |
| 5,225,034 | 7/1993 | Yu et al. | 156/636 |
| 5,230,833 | 7/1993 | Romberger et al. | 252/363.5 |
| 5,244,534 * | 9/1993 | Yu et al. | 156/636 |
| 5,320,706 | 6/1994 | Blackwell | 156/636 |
| 5,340,370 * | 8/1994 | Cadien et al. | 51/308 |
| 5,354,490 | 10/1994 | Yu et al. | 252/79.1 |
| 5,498,199 | 3/1996 | Karlsrud et al. | 451/289 |
| 5,525,191 | 6/1996 | Manlar et al. | 156/636.1 |
| 5,554,064 * | 9/1996 | Breivogel et al. | 451/41 |
| 5,645,736 * | 7/1997 | Allman | 106/3 |
| 5,697,992 * | 12/1997 | Ueda et al. | 51/307 |
| 5,733,819 * | 3/1998 | Kodama et al. | 106/3 |
| 5,759,087 * | 6/1998 | Masumura et al. | 451/36 |
| 5,759,917 * | 6/1998 | Grover et al. | 438/692 |
| 5,769,689 * | 6/1998 | Cossaboon et al. | 451/36 |
| 5,783,489 * | 7/1998 | Kaufman et al. | 438/692 |
| 5,816,891 * | 10/1998 | Woo | 451/36 |
| 5,866,031 * | 2/1999 | Carpio et al. | 252/79.1 |
| 5,916,855 * | 6/1999 | Avanzino et al. | 51/307 |
| 5,934,980 * | 8/1999 | Koos et al. | 451/41 |
| 5,993,686 * | 11/1999 | Streinz et al. | 252/79.3 |
| 6,028,006 * | 2/2000 | Bawa et al. | 438/692 |
| 6,120,354 * | 9/2000 | Koos et al. | 451/41 |

OTHER PUBLICATIONS

Keenan et al., General College Chemistry, (Harper & Row, Publishers, Inc., NY, NY, copyright 1980) pp. 493–494.*

Parks, G.A., The Isoelectric Points of Solid Oxides, Solid Hydroxides, and Aqueous Hydroxo Complex Systems, *Chemical Reviews* (1965). Month unknown, 177–198.

Petrucci, R.H., *General Chemistry: Principles and Modern Applications,* Fourth Edition, Macmillan: New York (1985). Month unknown, 539.

* cited by examiner

Primary Examiner—Richard D. Lovering
Assistant Examiner—Daniel S. Metzmaier
(74) Attorney, Agent, or Firm—Pollock, Vande Sande & Amernick; Robert M. Trepp

(57) ABSTRACT

A slurry containing abrasive particles and a pH buffering component comprising at least one acid or salt thereof and at least one base is especially useful for polishing surfaces, including those used in microelectronics.

19 Claims, 2 Drawing Sheets

PH-BUFFERED SLURRY AND USE THEREOF FOR POLISHING

TECHNICAL FIELD

The present invention is concerned with slurry compositions that are especially suitable for polishing surfaces. The present invention finds particular applicability in microelectronics. Moreover, the present invention can also be used for other substrates. The slurries of the present invention exhibit resistance to cross-contamination.

BACKGROUND OF THE INVENTION

In the microelectronics industry, during the manufacture of an integrated circuit, surfaces that are typically scratch-free are polished for the purpose of planarizing the structure involved and/or removing unwanted material. The polishing involved is chemical mechanical polishing. For example, metals such as aluminum, copper, and tungsten are planarized. These metal surfaces are oxidized so that the polishing abrasive does not produce scratches. Moreover, there is typically a refractory metal liner beneath the aluminum, copper or tungsten providing good adhesion to the underlying insulator and good contact resistance to lower level metallizations. The liners can be niobium, tantalum and titanium alone or in combination with their nitrides, or any other refractory metal. In practice, it is often necessary to employ a multistep procedure in order to achieve the desired polishing results. For instance, a primary polish is employed for removing large or major amounts of the stock material, followed by a secondary polish for removing scratches caused by the primary polish and/or for removing a different underlying or liner material. Typically, these two polishing steps are carried out on separate polishing tables. However, there are often two or more polishing tables per polisher so that the entire procedure can be performed on one piece of machinery. Each aspect of each polishing step, such as the polishing pads, the mechanical rates of operation, and the polishing slurries are tailored for its particular function. Accordingly, the slurry that is used for the primary polishing step is often quite different in its chemical composition from that used in the second polishing step.

A problem often encountered results when one of the polishing slurries becomes contaminated such as from carry over of amounts of the other slurry, cleaning material or a biproduct of the polishing procedure. For instance, cross-contamination commonly occurs when minor amounts (e.g. a few drops) of the primary polishing slurry become entrained on the wafer or wafer carrier and is then deposited on the polishing platen for the second polishing step where it then becomes mixed with the second polishing slurry at the point of use of the second polishing slurry. In the event the primary slurry contains relatively high concentrations of chemicals or ions, even a few drops when mixed with the second slurry can result in diminishing the effectiveness of the second slurry. A frequent example of this occurs when an extremely acidic slurry is employed as the primary slurry and a relatively neutral slurry as the second slurry. In such a situation, even a few drops of the acidic slurry can cause the neutral slurry to become acidic, thereby diminishing its effectiveness. Previous attempts to overcome this problem include extensive rinsing of the wafer and carrier between polishing steps in deionized water and creating barriers between the polishing steps in order to prevent splashing of one slurry into the other. However, these prior solutions are not entirely satisfactory since the wafer must pass from one polishing platen to the other without drying and the two polishing tables are located close to each other. Accordingly, it would be desirable to overcome the contamination problem.

SUMMARY OF INVENTION

The present invention provides a slurry composition that is resistant to pH changes in the slurry such as caused by cross-contamination. Accordingly, the present invention provides slurry compositions suitable for polishing that overcome the above-discussed problems of the prior art. In particular, the present invention provides slurries which are resistant to pH changes.

The present invention is directed to slurry compositions containing abrasive particles and a pH buffering component. The pH buffering component comprises at least one acid or salt thereof or mixture thereof and at least one base or salt thereof or mixture thereof. The concentration of the acid or salt is about $10^{-5}$ M to about $10^2$ M. The concentration of the base and/or salt thereof is about $10^{-5}$ M to about $10^2$ M. The pH of the slurry is about 3 to less than 11.

The present invention is also concerned with a method for polishing a surface. The method of the present invention comprises providing on the surface to be polished, a slurry of the type disclosed above. The surface is then polished by contacting the surface having the slurry thereon with a polishing pad.

Still other objects and advantages of the present invention will become readily apparent to those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various apparent respects, without departing from the invention. Accordingly, the description is to be regarded as illustrative in nature and not as restrictive.

BEST AND VARIOUS MODES FOR CARRYING OUT INVENTION

Figure 1:
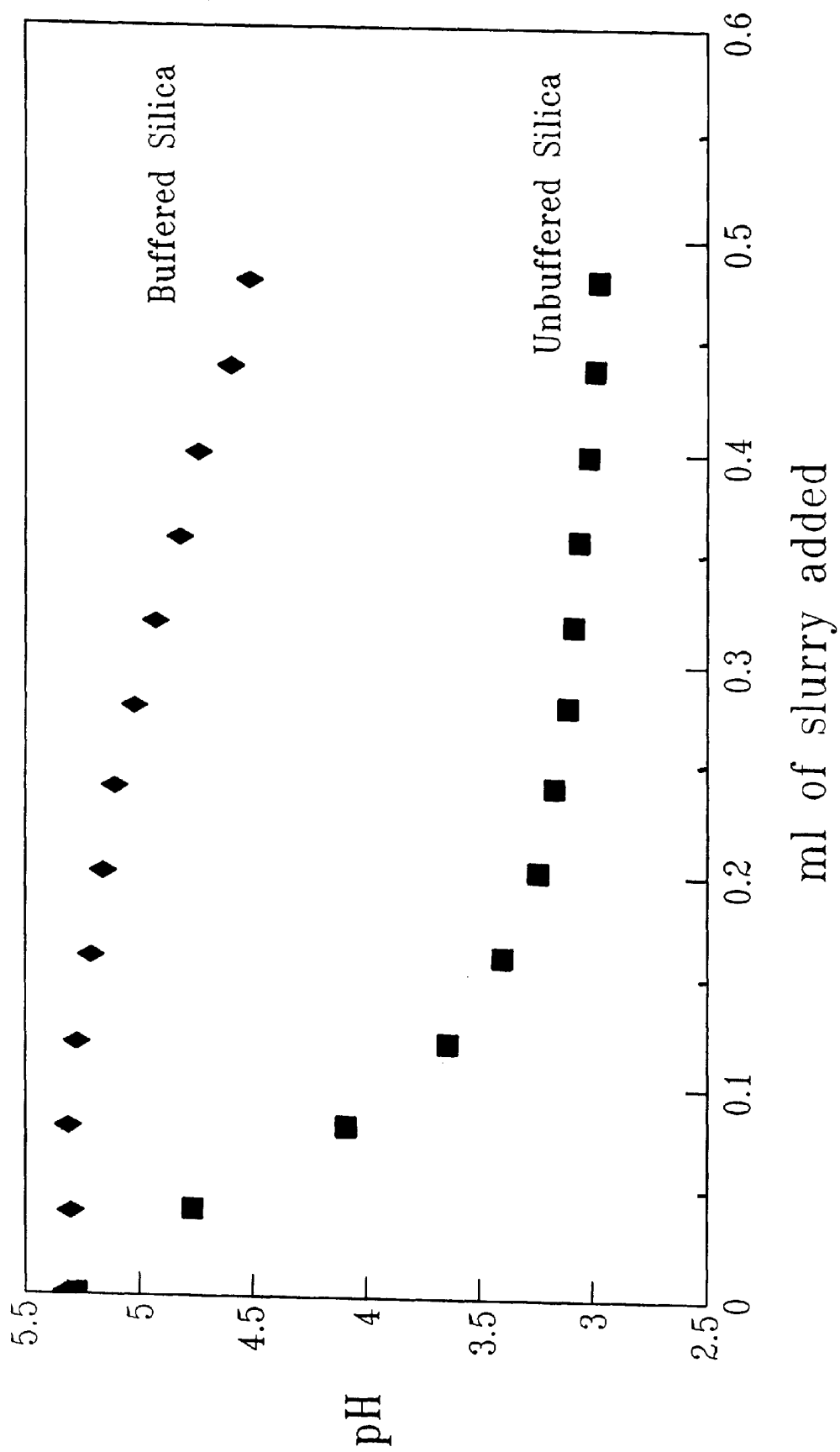
FIG. 1 is a graph illustrating the effect on pH in unbuffered and buffered silica slurry by adding ferric nitrate containing slurry.

According to the present invention, a slurry comprising abrasive particles and a pH buffering component is provided. The buffering component contains at least one acid and/or salt thereof and at least one base and/or salt thereof. Typically, the acid or salt thereof is a relatively weak acid or salt thereof, having a $PK_a$ of about 2 to about 7. Likewise, the base or salt thereof employed is typically a weak base exhibiting a $PK_a$ of about 7 to about 11. Examples of suitable acids or salts include organic and inorganic acids or salts thereof such as acetic acid, citric acid, boric acid, oxalic acid, tartaric acid, malic acid, formic acid, lactic acid, benzoic acid, nitric acid, phosphoric acid, hydrochloric acid, sulfuric acid, potassium hydrogen phthalate, potassium dihydrogen phosphate, ethylene diamine tetraacetic acid (EDTA) and disodium hydrogen phosphate. Examples of suitable bases and salts thereof include potassium hydroxide, sodium hydroxide, ammonium hydroxide, tertiary amines such as triethanol amine, trisodium phosphate, sodium carbonate, sodium bicarbonate, borax, calcium carbonate and tris(hydroxymethyl)aminomethane. The amount of acid and base can vary widely and can be readily determined by those skilled in the art without undue experimentation, once aware of the present disclosure.

Typically, the concentration of each of the acid or salt thereof and base is about $10^{-5}$ M to about $10^2$ M and more typically about $10^{-3}$ M to about $10^{-2}$ M, depending upon the strength of the acid and base, the original pH of the slurry to be buffered, the desired pH and the buffer capacity that is needed for the particular polishing application. Furthermore, the final pH of the buffered slurry need not be the same as the initial pH of the slurry, but can change in order to optimize the polishing rate of the slurry for any particular polishing operation.

By way of background, buffers function because when the acid or base has reached its dissolution equilibrium, the acid or base is not always fully dissociated. Therefore, the equilibrium for the dissociation of the acid or base can be affected by the addition of common ions, either $H^+$ or $OH^-$. Thus, when either of these ions are added to the solution (corresponding to an acidic or basic contamination), the dissociation equilibrium necessitates that either more or less of the buffering acid or base dissociates, which then helps to maintain the pH of the slurry as described in Petrucci, *General Chemistry, Principles and Modern Applications,* 4th Edition, McMillan, New York, 1985, page 539.

The most preferred buffer combination employed pursuant to the present invention is a combination of acetic acid and ammonium hydroxide when buffering silica-based slurries. In particular, this combination exhibits high solubility in the slurry and does not cause the abrasive to precipitate out of solution, solidify and/or gel. Also, this buffer combination is advantageously free of metal cations. Moreover, employing the buffering agents in accordance with the present invention does not reduce the rate of polishing.

The abrasive particles employed include those conventionally used in polishing slurries. Examples of suitable abrasive particles include alumina, silica, ferric oxide, zirconia, ceria, and titanium dioxide and mixtures thereof. The abrasive particles typically have a particle size of about 10 to about 1000 nanometers and preferably about 50 to about 200 nanometers. The amount of abrasive particles is typically about 0.2 to about 20% by weight and preferably about 1% to about 5% by weight. Also, the slurry is preferably an aqueous slurry. Other types of suitable slurries include those using as the diluent organic solvents such as propylene carbonate and mono and polyhydric alcohols such as methanol, ethanol, ethylene glycol and glycerol. Of course, mixtures of these diluents as well as mixtures with water can be used when desired.

In addition, the slurry composition typically includes a chemical etching agent to facilitate the polishing process when polishing metals such as tungsten, aluminum or copper and liners such as refractory metals and their nitrides including niobium, tantalum, titanium and nitrides thereof. Typical etching agents are ferric nitrate, potassium iodate, ammonium cerium nitrate, potassium ferricyanide, silver nitrate, sodium hypochlorite, potassium perchlorate, potassium permanganate or hydrogen peroxide. Typically, the etching agent is present in amounts of about 0.1 to about 5 molar and more typically about 0.2 to about 1 molar.

Figure 2:
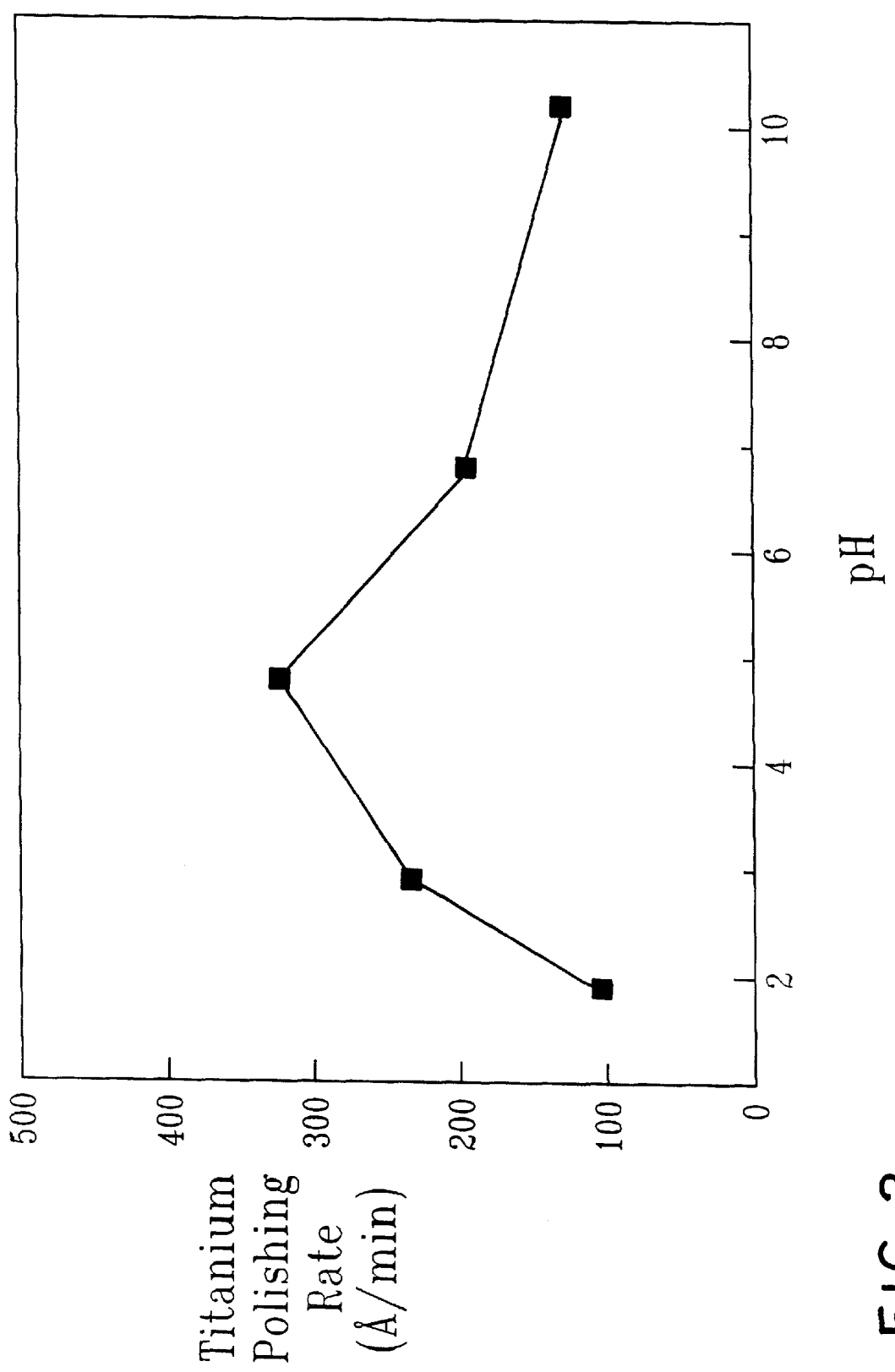
FIG. 2 is a graph illustrating the polishing rate as a function of pH.

An example of a typical 2-step process employing the present invention involves polishing metallic interconnects such as tungsten, aluminum or copper. The initial slurry employed in many cases has a pH of about 1 to about 6, more typically about 2, which can cause dramatic changes in the pH of the second slurry employed which typically has a pH of about 2 to about 10, an example of which is 5. FIG. 1 illustrates the effect of adding minor amounts of a primary slurry containing 5% by weight ferric nitrate, 1% by weight alumina and 94% water to a silica-based slurry typically used as the second polishing composition. Adding only a few drops of the primary slurry to the second slurry causes a significant change in the pH of the slurry, thereby resulting in a reduction in the polishing rate of titanium of up to about 40%. See FIG. 2 that illustrates the titanium polishing rate as a function of pH. On the other hand, FIG. 1 also illustrates that by employing the buffering technique of the present invention, the pH of the second slurry is substantially constant upon the addition of the primary slurry. (See curve 2 in FIG. 1.)

In addition, the inclusion of the buffering material in the second slurry does not change the polishing rate to any noticeable degree. For instance, a typical unbuffered silica slurry polishes titanium at a rate of 730 Å per minute. The silica slurry when buffered with $2 \times 10^{-3}$ M acetic acid and $1 \times 10^{-3}$ M potassium hydroxide, polishes titanium at a rate of about 745 Å per minute.

A further advantage of the present invention is the ability to enhance the cleaning of the wafers after the polishing. It is well known that cleaning or removing residual abrasive particles such as alumina, silica, ceria, titanium dioxide, ferric oxide or zirconia from the surface of a silicon wafer is quite difficult. For example, see U.S. Pat. Nos. 5,320,706 and 5,525,191. This is partially caused by the small abrasive particles and the silicon wafer each having a small surface electric charge that depends upon pH. At a pH where the surface charge on the wafer is opposite to that of the particle, there exists a strong electrostatic attraction between the two, thereby resulting in a strong bond between contaminating particles and the wafer surface.

Once formed, breaking this relatively strong bond and thereby removing the contaminating particles becomes a difficult and challenging problem. By employing a buffered slurry that resists pH change, particles can be prevented from adhering to the surface of the wafer. By way of example, at pH of 6.2, a silicon oxide wafer has a negative surface charge; whereas, a titanium dioxide particle has a neutral surface charge, thereby resulting in a relatively weak attraction of the titanium dioxide to the silica surface. (See Parks, "The Isoelectric Points of Solid Oxides, Solid Hydroxides and Aqueous Hydroxide Complex Systems", *Chemical Reviews* (1965), pp. 177–198.) However, a change in the pH to about 4 due to contamination results in the titanium dioxide particle acquiring a positive surface charge while the silicon oxide wafer maintains its negative charge. This results in a much stronger attraction between the particle and silicon oxide wafer.

In such a situation, buffering the slurry at pH 6.2 is beneficial in order to prevent the surface charge of the titanium dioxide abrasive particle and the silicon wafer from changing due to contamination-induced pH changes.

According to certain aspects of the present invention, the slurry compositions of the present invention can also facilitate removal of residual metal cation contaminants such as $Fe^{3+}$, $Mg^{2+}$, $Ca^{2+}$, $K^+$ and $Na^+$ that can cause electrical failures of integrated circuits. Moreover, these contaminants are extremely difficult to remove. For instance, see U.S. Pat. No. 5,230,833 which shows that considerable effort has been undertaken to produce slurries with low metal ion concentrations in order to specifically avoid this problem. However, in polishing metals, it is often necessary to include metal cation-based etching agents, often referred to as oxidizing agents, such as ferric nitrate and potassium iodate. Certain of the acids and bases employed according to the present invention as buffering agents can additionally function as complexing agents for these metal cations. For instance, citric acid, oxalic acid and triethanol amine will complex $Fe^{3+}$, a cation present from many commonly available metal polishing compositions.

Furthermore, those slurry compositions of the present invention containing an acid and/or base that also acts as a complexing agent can prevent precipitation of insoluble metal hydroxides which in turn can cause scratches on the underlying silicon wafer. By way of example, having one of the slurries contain ferric ions while another has a pH of >6, when contacted with each other can result in precipitation of ferric hydroxide such as on the polishing pad, which in turn can create scratching. In such a situation, it is preferable to include in the slurry with the higher pH of about 6, an acid or base that also acts as a complexing agent for ferric ions. This in turn will result in complexing the ferric ions, thereby preventing any hydroxide from precipitating out of solution.

The parameters of the polishing or planarizing can be determined by those skilled in the art once aware of this disclosure, without exercising undue experimentation. For instance, the speed of rotation of the polishing pads is about 10 to about 150 rpm, and the speed of the rotation of the wafer carrier is about 10 to about 150 rpm and the down force about 2 to about 10 psi. The polishing pads are those conventionally used in polishing for microelectronics.

Surfaces that can be polished according to the present invention include silicon dioxide, aluminum, copper, tungsten and refractory metals such as niobium, tantalum and titanium and their nitrides.

The foregoing description of the invention illustrates and describes the present invention. Additionally, the disclosure shows and describes only the preferred embodiments of the invention, but as mentioned above, it is to be understood that the invention is capable of use in various other combinations, modifications and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A multistep method for polishing a surface which comprises polishing said surface by first contacting it with a first slurry comprising abrasive particles and having a pH of about 1 to about 6 and contacting and polishing the surface having the slurry thereon with a polishing pad; followed by providing on said surface a second and different slurry comprising abrasive particles, a pH of about 3 to about 11 and a pH buffering component comprising at least one acid or salt thereof or mixture thereof in a concentration of about $10^{-5}$ M to about $10^2$ M and at least one base or salt thereof or mixture thereof in a concentration of about $10^{-5}$ M to about $10^2$ M and wherein the buffering component of the second slurry is free of metal cations, and polishing said surface having said second slurry thereon by contacting it with a polishing pad, wherein said acid and/or said base also acts as a complexing agent for metal cations.

2. The method of claim 1 wherein said acid or salt thereof is selected from the group consisting of acetic acid, citric acid, boric acid, oxalic acid, hydrochloric acid, sulfuric acid, tartaric acid, nitric acid, malic acid, formic acid, lactic acid, benzoic acid, and mixtures thereof and wherein said base or salt thereof is selected from the group consisting of ammonium hydroxide, tris(hydroxymethyl) amino methane, triethanol amine and mixtures thereof.

3. The method of claim 2 wherein the pH of the first polish slurry is about 2 and the pH of the second slurry is 5.

4. The method of claim 1 wherein said abrasive particles are selected from the group consisting of alumina, silica, zirconia, ceria, titanium dioxide, ferric oxide and mixtures thereof.

5. The method of claim 1 wherein said abrasive particles have a particle size of about 10 to about 1000 nanometers.

6. The method of claim 1 wherein said slurry is an aqueous slurry.

7. The method of claim 6 wherein said slurry further contains an organic diluent.

8. The method of claim 7 wherein said organic diluent is selected from the group consisting of propylene carbonate, methanol, ethanol, ethylene glycol, glycerol, and mixtures thereof.

9. The method of claim 1 wherein said slurry contains an organic diluent.

10. The method of claim 9 wherein said organic diluent is selected from the group consisting of propylene carbonate, methanol, ethanol, ethylene glycol, glycerol, and mixtures thereof.

11. The method of claim 1 wherein said surface is selected from the group consisting of alumina, copper, tungsten and silicon dioxide.

12. The method of claim 1 wherein beneath said surface to be polished is a refractory metal liner.

13. The method of claim 1 wherein said refractory metal liner is selected from the group consisting of niobium, tantalum, titanium, nitrides thereof and mixtures thereof.

14. The method of claim 1 wherein the speed of said pad during said polishing is about 10 to about 150 rpm, and the speed of the wafer carrier is about 10 to about 150 rpm.

15. The method of claim 1 wherein the polishing with the second slurry removes scratches caused by the first polish slurry.

16. The method of claim 1 wherein the polishing with the second slurry removes an underlying material that differs from that removed by the first polish slurry.

17. The method of claim 1 wherein the pH of the first polish slurry is about 2 and the pH of the second slurry is 5.

18. The method of claim 1 which consists essentially of polishing said surface by first contacting it with said first slurry and contacting said surface with a polishing pad, followed by providing on said surface said second and different slurry and polishing said surface by contacting it with a polishing pad.

19. The method of claim 1 wherein said buffering component provides for a buffered slurry which resists pH change due to differences in pH between said first slurry and said second slurry, and does not significantly change the polishing rate of said second slurry.

* * * * *